(12) United States Patent
Gerlach et al.

(10) Patent No.: US 6,710,338 B2
(45) Date of Patent: Mar. 23, 2004

(54) FOCUSED ION BEAM SYSTEM

(75) Inventors: Robert L. Gerlach, Portland, OR (US); Paul Tesch, Portland, OR (US); Noel Paul Martin, Hillsboro, OR (US); Walter Skoczylas, Aloha, OR (US); Drew Procyk, Portland, OR (US)

(73) Assignee: Fei Company, Hillsboro, OR (US)

( * ) Notice: Subject to any disclaimer, the term of this patent is extended or adjusted under 35 U.S.C. 154(b) by 0 days.

(21) Appl. No.: 09/982,110

(22) Filed: Oct. 17, 2001

(65) Prior Publication Data

US 2002/0084426 A1 Jul. 4, 2002

Related U.S. Application Data

(60) Provisional application No. 60/241,536, filed on Oct. 18, 2000.

(51) Int. Cl.[7] .............................. G01N 23/00; H01J 3/14
(52) U.S. Cl. ...................... 250/309; 250/306; 250/307; 250/398; 250/423 R; 250/424; 250/396 R; 250/492.3
(58) Field of Search ................................ 250/306, 307, 250/309, 310, 396 R, 398, 423 R, 424, 492.2, 492.3; 427/526; 546/171

(56) References Cited

U.S. PATENT DOCUMENTS

| | | | |
|---|---|---|---|
| 4,698,236 A | * 10/1987 | Kellogg et al. | ............. 427/526 |
| 5,196,707 A | * 3/1993 | Gesley | ........................ 250/398 |
| 5,342,950 A | * 8/1994 | Kilpper et al. | .............. 546/171 |
| 5,844,416 A | * 12/1998 | Campbell et al. | ............ 324/750 |
| 6,032,513 A | * 3/2000 | Chorush et al. | ............. 73/23.35 |
| 6,107,626 A | * 8/2000 | Wang et al. | ................. 250/288 |
| 6,268,608 B1 | * 7/2001 | Chandler | ................. 250/492.2 |
| 6,300,628 B1 | * 10/2001 | Fujii et al. | .................. 250/309 |
| 6,331,713 B1 | * 12/2001 | Smick et al. | ............. 250/497.1 |
| 6,348,689 B1 | * 2/2002 | Koyama | ..................... 250/309 |
| 6,365,905 B1 | * 4/2002 | Koyama et al. | ....... 250/492.21 |
| 6,407,001 B1 | * 6/2002 | Scott | .......................... 438/712 |

* cited by examiner

Primary Examiner—John R. Lee
Assistant Examiner—Mary El-Shammaa
(74) Attorney, Agent, or Firm—Michael O. Scheinberg

(57) ABSTRACT

A portion of an ion optical column is formed using a dielectric bushing to support metallic optical elements, electrically isolate them, and form a vacuum chamber around those elements. In particular, the dielectric bushing is suitable for forming an ion gun vacuum chamber in which are contained an emitter assembly and other optical elements, the gun vacuum chamber preferably being vacuum sealable separately from the system vacuum chamber. A compact ion column includes, within the system vacuum chamber, an automated variable aperture drive mechanism and a gun chamber vacuum isolation valve activation mechanism. Including these mechanisms within the vacuum chamber facilitates the design of multi-beam systems by eliminating mechanical feedthroughs that would interfere with the placement of other components in the vacuum chamber.

16 Claims, 6 Drawing Sheets

FOCUSED ION BEAM SYSTEM

This application claims priority from U.S. Prov. Pat. App. No. 60/241,536, which was filed on Oct. 18, 2000 and is hereby incorporated by reference.

TECHNICAL FIELD OF THE INVENTION

The invention relates to FIB (Focused Ion Beam) systems and in particular to FIB optical columns.

BACKGROUND OF THE INVENTION

FIB systems, while once used primarily by highly skilled technicians in laboratories, are being used more and more in the high volume manufacturing of products such as semiconductors and disk drives. Most focused ion beam systems are still designed as multipurpose machines that are suitable for a broad range of applications. While such systems are very versatile, they are relatively expensive to manufacture. With the migration of FIB systems from the laboratory to the production floor, it is important to make FIB systems easier to use and to improve their performance. Improved performance means being able to process material more efficiently and increasing resolution, that is, being able to focus the beam to a smaller spot to perform finer operations.

Part of making FIB systems more suitable for production involves reducing the cost and size of the optical column used to generate and focus the ion beam. Minimizing the column optical length reduces ion interactions within the beam. These interactions increase the beam diameter and reduce resolution. Minimizing the column width facilitates combining a FIB in a vacuum chamber with a second beam, such as an electron beam for a scanning electron microscope ("SEM"). Such systems allow a work piece to be inspected using an electron beam after the work piece is machined using the focused ion beam. In such dual beam systems, the FIB column preferably penetrates deeply into the vacuum chamber and consequently should have a narrow profile to clear the SEM column and work piece.

A part of the ion column that includes the ion source, and often a first lens, is referred to as an "ion gun." An ion gun typically includes an emitter, from which the ions are emitted, an extractor that provides a high voltage to assist in extracting ions from the emitter, an extractor aperture that helps to initially define the beam diameter, and a suppressor around the emitter that provides fine control of the emitter emission current. Because air molecules would interfere with the ions in the beam, the entire path of the ion beam is contained in a system vacuum chamber that maintains a high or an ultrahigh vacuum. The ion gun is often contained within its own separately sealable gun vacuum chamber so that the emitter will not be contaminated when the system vacuum chamber is opened to insert or remove a work piece. The mechanism for actuating the vacuum isolation valve that seals the gun vacuum chamber typically extends out of the system vacuum chamber.

An ion column also typically includes a beam aperture that is positioned after the ion gun and that further refines the beam diameter. Many FIB systems use an automatic variable aperture (AVA). An AVA typically includes a thin sheet of metal having multiple small holes of various sizes to form a line of apertures. A stage moves the aperture strip to position a hole of the desired diameter in the path of the beam. The mechanism for moving the aperture strip typically extends outside of the system vacuum chamber.

FIG. 1 is a partial cross-sectional drawing of a typical FIB column assembly 100. The column uses an ultrahigh vacuum gun chamber 102, which is composed of welded stainless steel surrounded by a magnetic shield 104 composed of a mumetal, that is, a metal that reduces transmission of magnetic fields into the column. Ion optical elements that carry a high voltage, such as a gun lens 110, a final lens 112, and deflector plates 114 are typically metallic elements that are supported and electrically isolated by complex alumina and machineable glass dielectric elements, such as a high voltage insulator 116. The metal optical elements are typically screwed or brazed to the dielectric elements, but may also be glued to the dielectrics using, for example, an epoxy.

Electrical and mechanical connections, or "feedthroughs" from inside to outside high vacuum chamber 102 must be sealed so that air does not leak into the vacuum chamber through the feedthroughs. There are known techniques for use in ultrahigh vacuum (UHV) systems, in which brazed-metal-to-ceramic elements are employed for high-voltage isolation and vacuum sealing. FIG. 1 shows high voltage electrical feedthroughs 120. FIG. 1 also shows mechanical feedthroughs for driving the automatic variable aperture and for positioning the emitter. The emitter is aligned within the gun chamber 102 by using four knobs 122 external to the gun chamber 102, which are coupled through differential screws (not shown) to an emitter/suppressor assembly by vacuum bellows and high voltage isolation. Such an arrangement is complex and expensive. The automatic variable aperture is moved by a drive mechanism 124 that is outside of the system vacuum chamber and a mechanical connection extends from the external drive mechanism to the aperture plate itself.

An ion pump port 130 connects to an ion pump for creating the ultra high vacuum within vacuum chamber 102, while a gun chamber vacuum isolation valve mechanism 132 allows vacuum chamber 102 to be vacuum isolated so that, for example, a system vacuum chamber in which the work piece is positioned and into which column 100 is inserted, can be opened to atmosphere without contaminating the elements in vacuum chamber 102. Vacuum isolation valve mechanism 132 extends through a wall of the system vacuum chamber. Column assembly 100 is mounted onto a system vacuum chamber using mounting flange 140.

In a conventional ion column design as described above, the overall, in-vacuum surface area is large. Because gases tend to adsorb onto surfaces in the vacuum chamber and the gas molecules desorb over time, a large surface area tends to increase the vacuum pumping requirements.

SUMMARY OF THE INVENTION

An object of the invention is to provide a high performance FIB optical column design of a less complex design.

In accordance with the present invention, a portion of an ion optical column is formed using a dielectric bushing to support metallic optical elements, electrically isolate them, and form a vacuum chamber around those elements. In particular, the dielectric bushing is suitable for forming an ion gun vacuum chamber in which are contained an emitter assembly and other optical elements, the gun vacuum chamber preferably being vacuum sealable separately from the system vacuum chamber.

In another aspect of the invention, a compact ion column includes, within the system vacuum chamber, an automated variable aperture drive mechanism and a gun chamber vacuum isolation valve activation mechanism. Including these mechanisms within the vacuum chamber facilitates the design of multi-beam systems by eliminating mechanical feedthroughs that would interfere with the placement of other components in the vacuum chamber.

It will be understood that the invention includes more than one novel aspect. Different embodiments can be constructed for different purposes using any one of, or combination of, the different aspects of the invention, and not all the advantages of the invention are, therefore, necessarily achieved by every embodiment that is within the scope of the attached claims.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
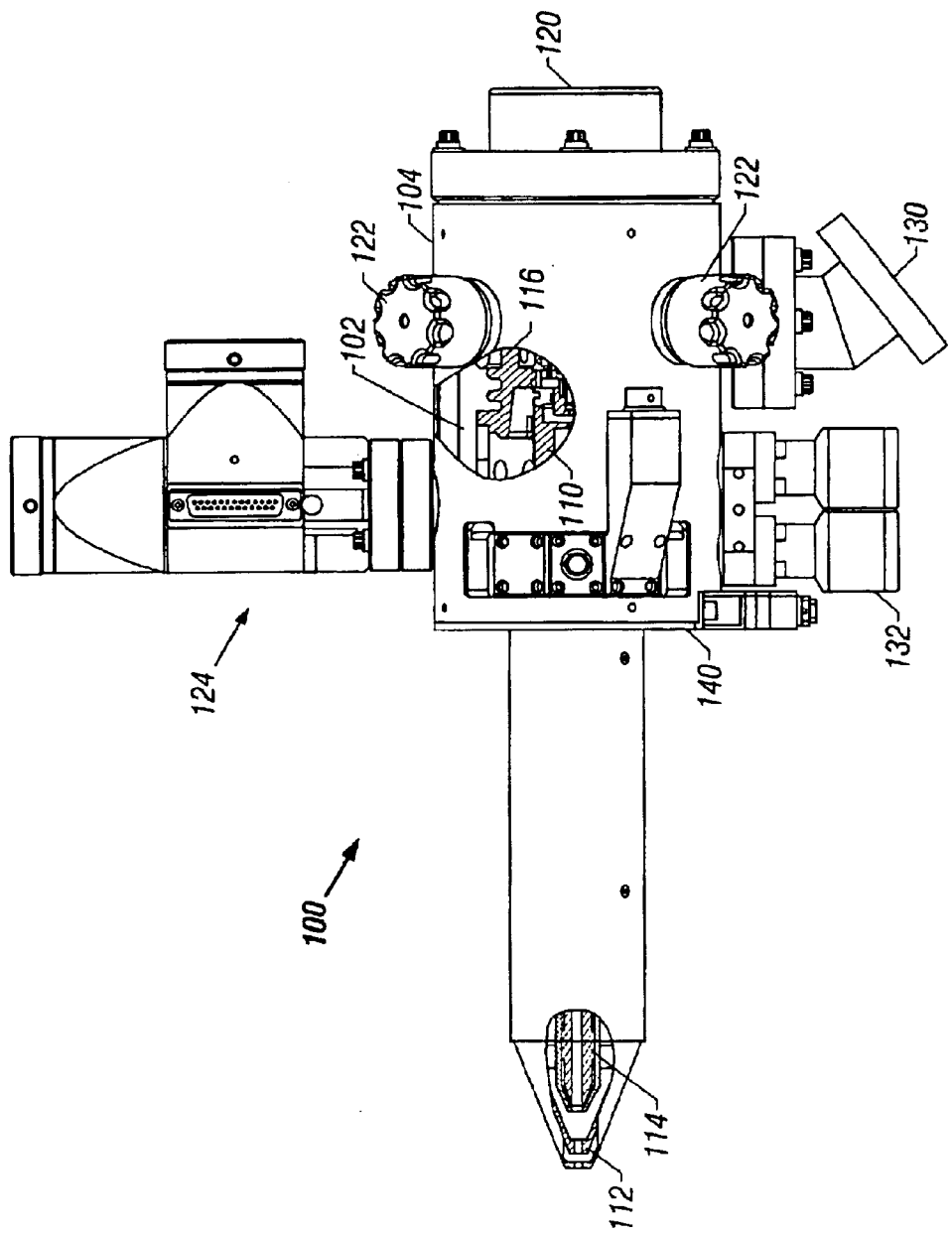
FIG. 1 shows a prior art FIB column, with portions of the outer covering removed to disclose construction details.
Figure 2A:
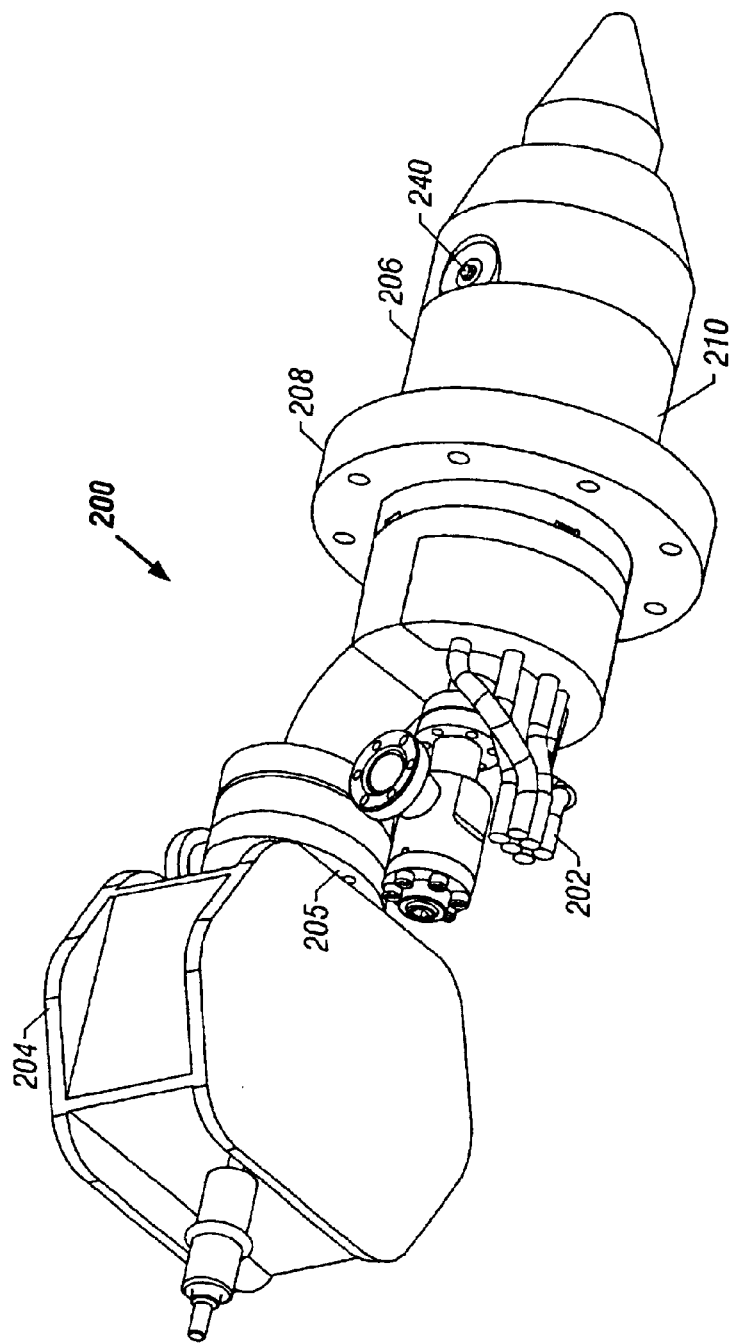
FIG. 2A is a drawing of the exterior of the FIB column of the present invention.
Figure 2B:
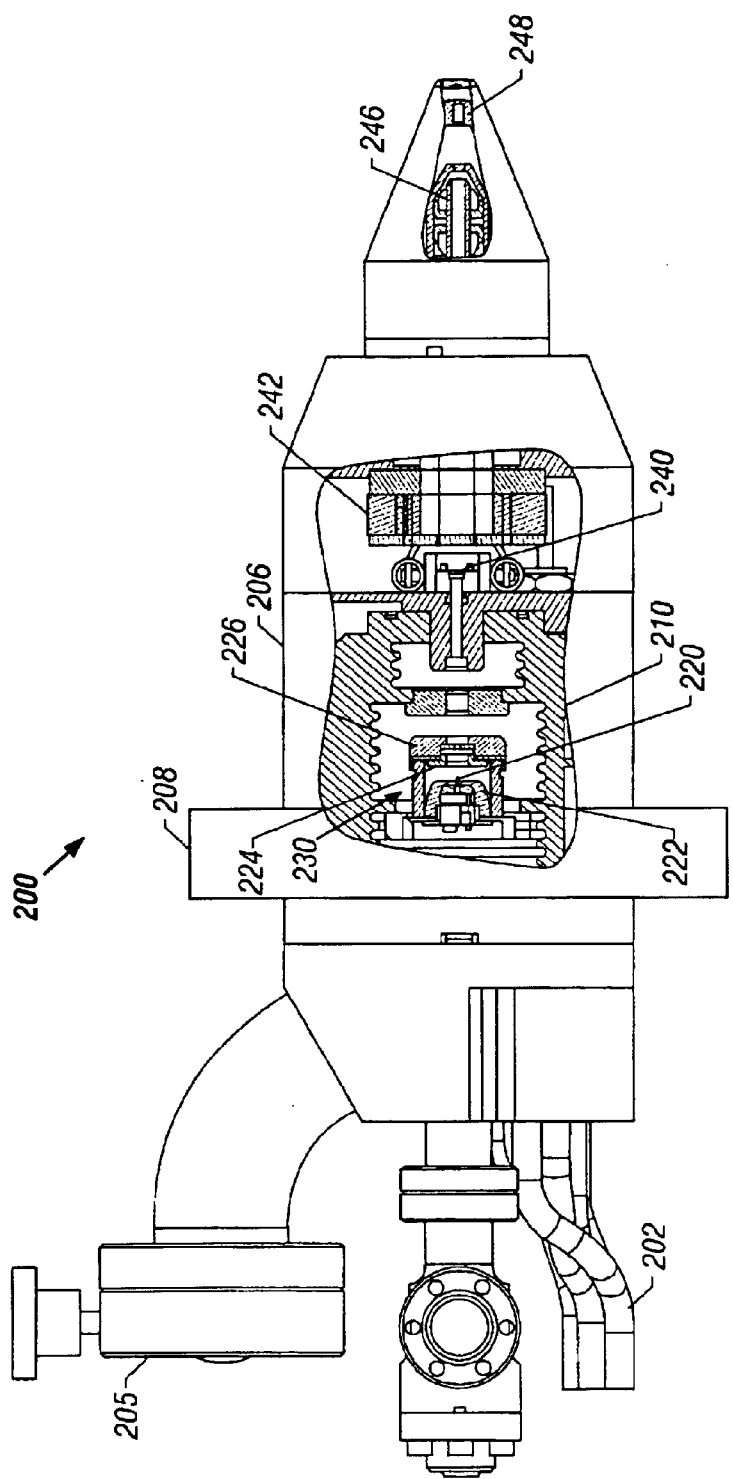
FIG. 2B shows the FIB column of FIG. 2A with a portion of the exterior cover removed to display a partial cross section.

FIGS. 2A and 2B show a preferred embodiment of the present invention. FIG. 2A shows the exterior of an ion column 200. High voltage cables 202 provide the high voltage necessary to operate the optical elements in column 200. An ion pump 204 attached to a flange 205 evacuates a gun chamber 206 to a high or ultra high vacuum. A flange 208 is used to secure column 200 to a system vacuum chamber (not shown), with the portion of column 200 containing the ion optical elements being positioned within the system vacuum chamber, which contains a work piece to which the ion beam is directed during operation.

As shown in FIG. 2B, gun chamber 206 is fabricated using a housing or gun bushing 210 of a dielectric material that forms the vacuum wall and provides mechanical support and high voltage isolation for the ion optical elements in the chamber. The lens elements are preferably glued or brazed into the dielectric material of gun bushing 210 using a fixture to ensure the elements are accurately aligned. FIG. 2A shows that there are no mechanical feedthroughs through the portion of column 200 that will be positioned in the system vacuum chamber.

FIG. 2B shows additional features of a preferred embodiment of the present invention. An emitter 220, a suppressor 222, an extractor 224 and a first lens 226 are combined into an ion emitter module 230, which is easily replaced, if necessary, in the field. The gun chamber 206, which includes its own vacuum pump, an ion pump (not shown) attached to port 204, can be vacuum isolated from the system vacuum chamber using an isolation valve 240. The isolation valve assembly 240, an X-Y aperture stage of an automated variable aperture 242, as well as deflection plates 246 and a final lens 248, are located outside of the gun chamber 206 and within the system vacuum chamber.

The optical column preferably has a short length to minimize beam broadening by mutual repulsion by the ions. Reducing the ion column optical length shortens the ion path to the target. To facilitate this short length while providing the ability of the column to extend into the system vacuum chamber, the isolation valve activation mechanism and aperture changing drive mechanism are preferably positioned within the system vacuum chamber. Positioning these mechanisms within the system vacuum chamber eliminates the requirement for corresponding mechanical feedthroughs that restrict the positioning of the ion column within the system vacuum chamber and increase system complexity.

Gun bushing 210 can be comprised of a ceramic, polymer, or even high resistivity semiconductor material and can optionally be contained within a metal column body (not shown). The optional metal body provides a steady platform for the gun and can be used to magnetically shield the ion beam. O-rings of an elastomeric material can provide vacuum seals between the gun bushing 210 and the metal chamber. Alternatively, if the system vacuum chamber surrounds gun bushing 210, then the portion of the metal body around the gun bushing might not be needed, and the diameter of the gun can be reduced.

The metal gun optical elements are glued or brazed inside the gun bushing 210 using suitable tools and fixtures, and post machined for accuracy if needed. Such manufacturing techniques are well known in the art of charged particle beam optics. A brazed assembly is less likely to produce outgassing in the vacuum chamber, but brazing has the disadvantage of requiring the assembly to be heated to a high temperature during construction. Note that the column has a narrow cross section and can be therefore deeply recessed into the main vacuum chamber. Recessing the column provides a relatively short optical path and reduces beam interactions, thereby improving ion beam optical properties.

The wires from the gun optical elements go through holes in the side of gun bushing 210 and are glued for vacuum integrity. Alternatively, the wires can be sealed by elastomeric O-rings, or can be fused or brazed into gun bushing 210. These methods provide very simple electrical feedthroughs. Outside the gun bushing, the wires are potted with standard high voltage, high temperature potting material. High voltage "flying leads" with connectors on their ends can be used, or the connectors can be potted to the gun bushing or into holes in the bushing. These methods provide simple connector means. Persons skilled in basic vacuum system fabrication techniques will be able to make such connectors, as well as the rest of ion column described herein, based upon the guidance provided in this specification.

A vacuum pump, preferably an ion pump, may be placed on top of the main column flange and optionally has a vacuum valve to maintain vacuum in the vacuum pump when the gun is serviced, such as when the emitter assembly is replaced. The high voltage connectors as well as the gun access flange need to be removed for this servicing using a column using this configuration. Alternatively an ion pump can be fastened to the side of the gun chamber top, and the various wires and other services to the gun and lower column can be connected to the outer perimeter of the gun bushing top. Using this alternative configuration, the emitter module can be accessed through the top center of the gun without removing some or all of the services described above.

Isolation valve 240, automated variable aperture 242, and their associated activating or drive mechanisms are preferably positioned completely inside the main system vacuum chamber to provide a short column length. The isolation valve is a small mechanism, which is air-actuated by an air line down along the column chamber body. The AVA preferably uses a very small X-Y stage, preferably piezoelectrically actuated, which is vacuum compatible and has low magnetic fields.

To provide aperture arrays, electroformed or electro-etched apertures can be employed for the medium to large size apertures. Conventional techniques can be used to fabricate small apertures into thin (about 25 microns) metal sheets to about three microns accuracy. Alternatively, the apertures can be formed by laser ablation or FIB milling, or by a combination of electroforming or electroetching plus laser ablation or FIB. In any case, two dimensional aperture arrays of about 100 apertures may be formed to provide long times (many months) between aperture replacements.

Figure 3A:
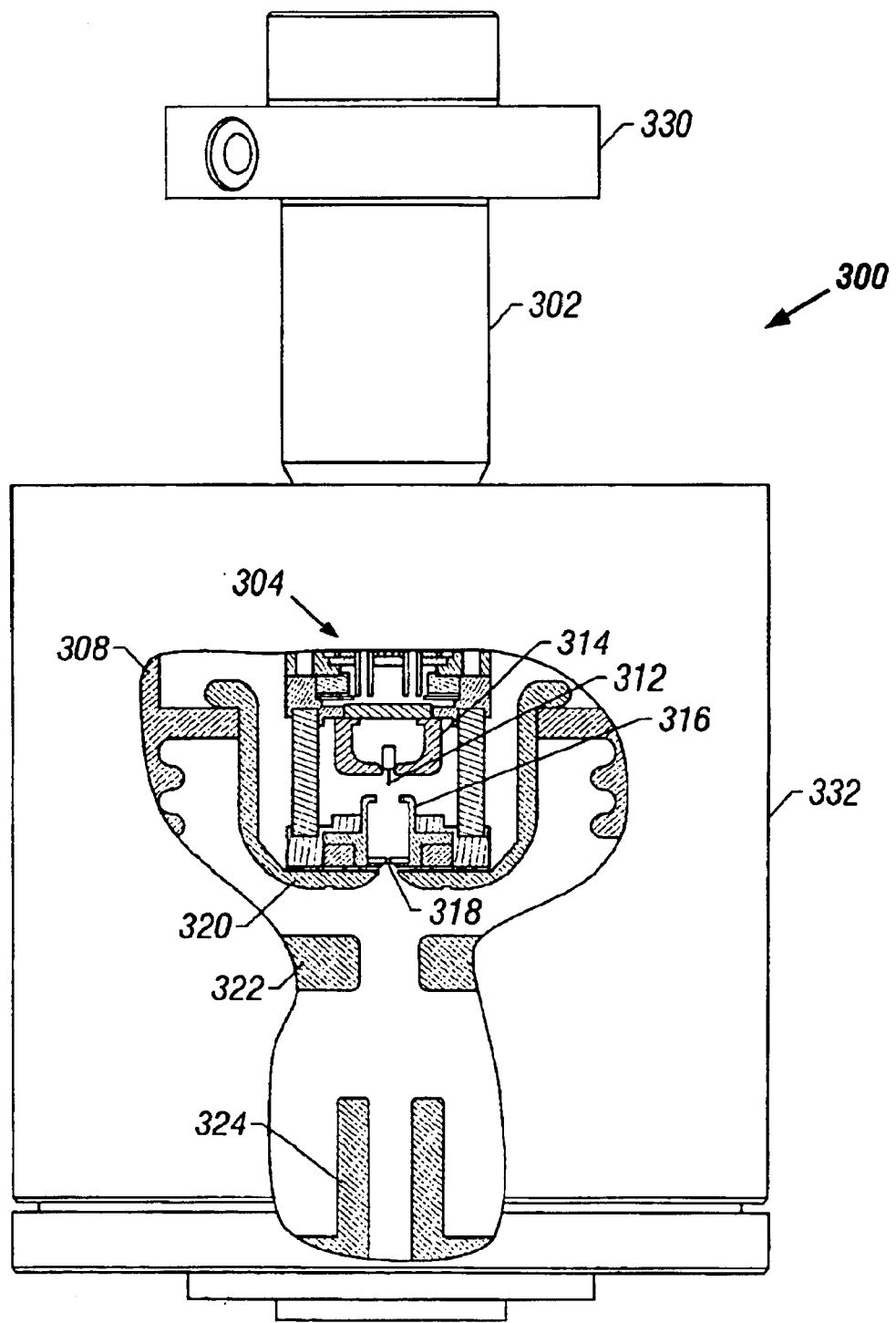
FIG. 3A is a cross-sectional drawing of an emitter assembly in which the first gun lens element is separate from the extractor but at the same potential as the extractor

FIG. 3A shows one preferred design for an ion gun assembly 300. Ion gun assembly 300 includes an emitter assembly support 302 that supports and positions an emitter assembly 304 relative to a gun bushing 308. Emitter assembly 304 includes an emitter 312, a suppressor 314, an extractor cap 316, and the extractor aperture 318. Gun bushing 308 supports a first gun lens element 320, which is separate from the emitter assembly 304 and is maintained at the same electrical potential as extractor cap 316. Gun bushing 308 also supports a second gun lens element 322 and a third gun lens element 324. An emitter assembly flange 330 is used to secure emitter assembly support 302 in position within the gun vacuum chamber. As described above, gun bushing 308 can be surrounded by a steel chamber 332. Ion gun assembly 300 has the following advantages compared to the prior art:

A. Replacing emitter assembly 304 exchanges the emitter 312, extractor cap 316 and the extractor aperture 318 as one assembly. This reduces the effort to replace these individual parts.

B. The alignment between the emitter 312 and the extractor aperture 318 can be more accurate than in prior art design. The radial runout, that is, the offset of the axes of the individual parts from the axes of the assembly, can be kept very small by adjustments during assembly. In the prior art, this runout depended upon individual part clearances and tolerance stackups between multiple parts. Maintaining a small runout between the emitter and extractor aperture is particularly important for large beam applications, where spherical aberrations prevail.

C. By having the first lens element 320 remain in the chamber when the extractor is removed, the first lens element is protected from scratches and dust, which is important because the electric field stress on it is very large. Scratches or contamination can cause the lens element 320 to break down when subjected to a high voltage under normal operating conditions. Also, the first lens element 320 can be closely aligned with the other gun lens elements during assembly to minimize radial runout between those parts.

In one embodiment, emitter assembly support 302 is movable in the X-Y plane to position the emitter 312, suppressor 314, extractor cap 316 and extractor aperture 318 assembly with respect to the gun lens 320. In another embodiment, emitter assembly 304 can be a pre-positioned assembly, which fits into a precision recess in gun bushing 308 or first gun lens element 320.

Figure 3B:
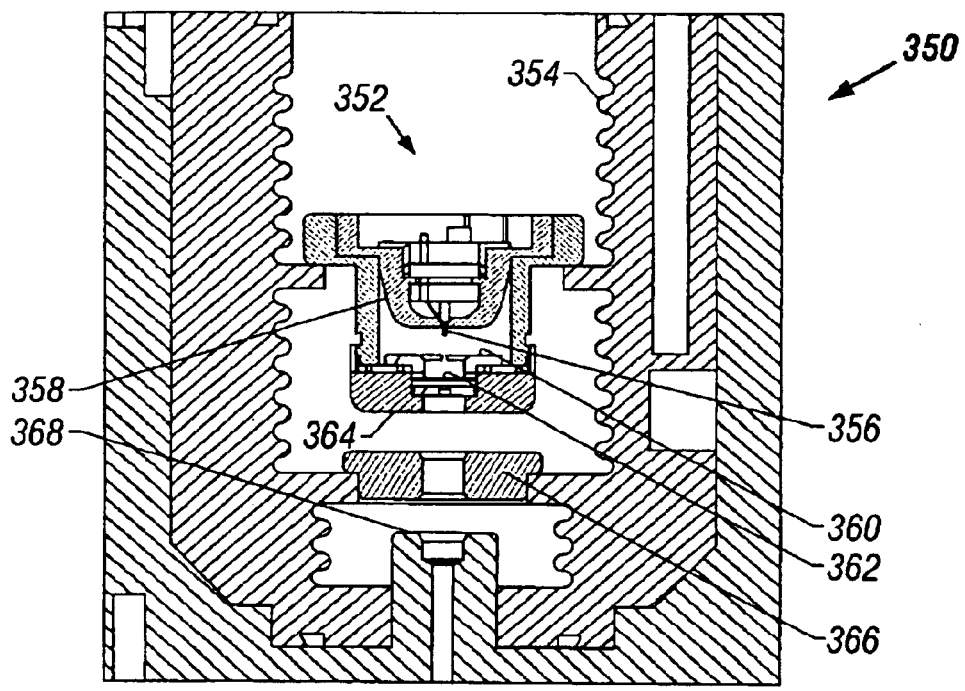
FIG. 3B is a cross sectional drawing of an emitter assembly in which the first gun lens element is attached to the extractor.

FIG. 3B shows an alternate design for an ion gun assembly 350 that includes an emitter assembly 352 mounted on a gun bushing 354. Emitter assembly 352 includes an emitter 356, a suppressor 358, an extractor 360, and an extractor aperture 362. A first gun lens element 364 is attached to extractor 360, rather than being mounted to gun bushing 354 as in ion gun 300 of FIG. 3A. The design of FIG. 3B is simpler, but the first gun lens element 364, which forms the lower surface of the extractor 360, is removed with the emitter assembly and is therefore more susceptible to being scratched and subsequently suffer high voltage breakdown. Moreover, when the first gun lens element 364 is removed with the emitter assembly for emitter and extractor aperture replacement, precise alignment of first gun lens element 364 with the other gun lens elements, such as a lens element 366 and lens element 368, is more difficult because first lens element 364 is mounted on the emitter assembly 352 and the other elements are mounted on gun bushing 354.

Figure 4:
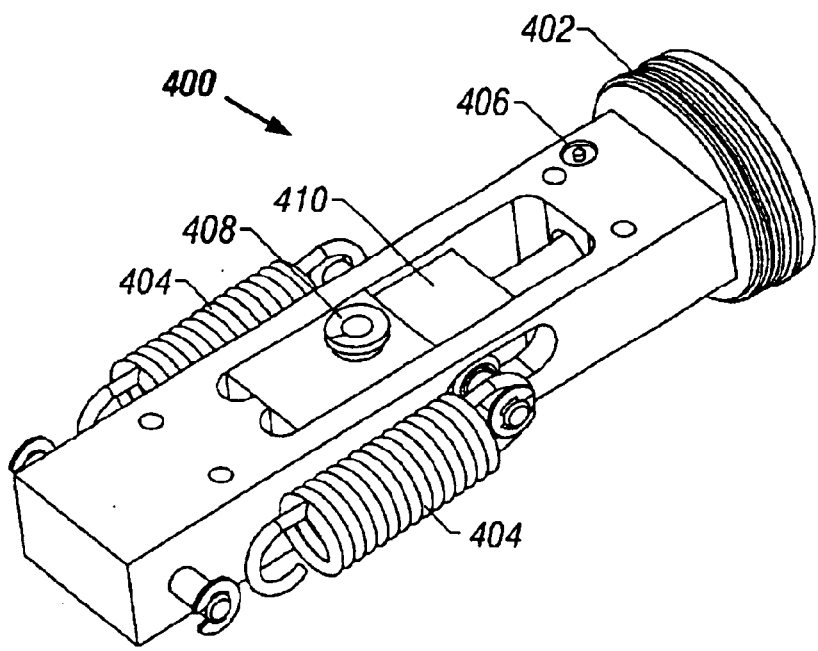
FIG. 4 is a drawing of an isolation valve activation mechanism suitable for use inside a vacuum chamber.

FIG. 4 shows a preferred embodiment of an in-vacuum isolation valve mechanism 400 used on the column of FIGS. 2A and 2B. Sealed metal bellows 402 uses air pressure fed through a hole 406 in the side of the gun to open a valve. Springs 404 return the valve to the closed position when the air pressure is off. A wedge sealing surface on slider 410 slides under the valve seat 408 placed at the base of the gun (not shown). An O-ring on the wedge surface of slider 410 forms the valve seal. Valve seat 408 has a hole through it to pass the ion beam from the gun to the lower column.

Figure 5:
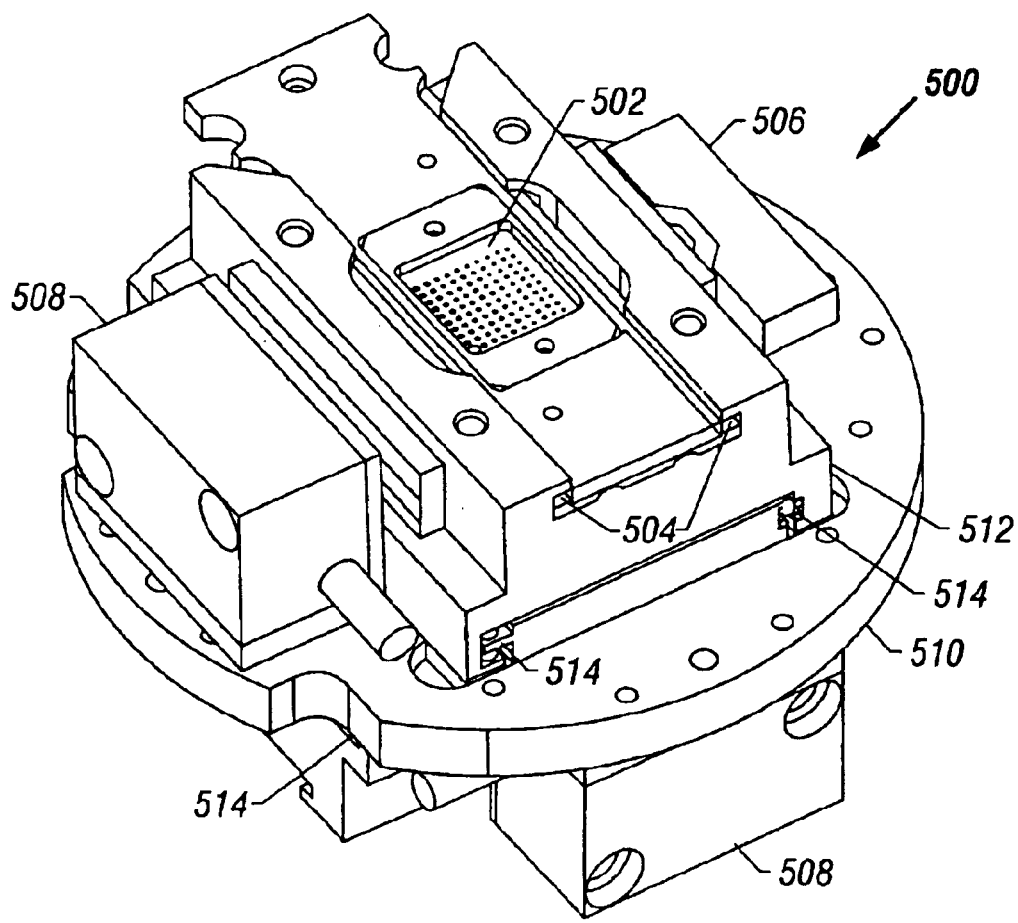
FIG. 5 is a drawing of a piezoelectrically driven X-Y aperture motion stage suitable for use inside a vacuum chamber.

FIG. 5 shows a preferred aperture X-Y positioning stage 500 for moving an aperture array 502 to position a selected aperture in the ion beam path in the column of FIGS. 2A and 2B. Motion stage 500 includes slots 504 for holding the aperture plate and two piezoelectric drives 506 (one shown) to provide high speed, high-resolution motion of positioning stage 500 in the X and Y directions. A stage 510 moves in the X direction and a stage 512 moves in a Y direction, each on linear bearings 514. Linear encoders 508 provide accurate feedback of the X-Y stage motion. Aperture positions are reproducible to better than one micron.

Figure 6:
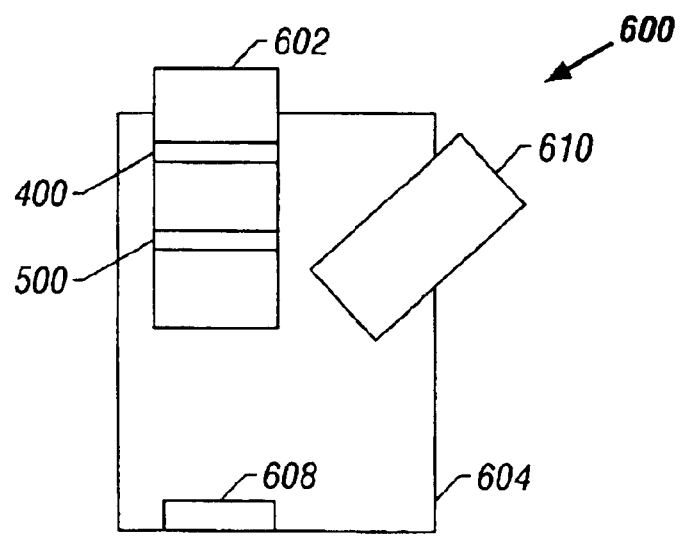
FIG. 6 shows schematically a multiple beam system using a column of the present invention.

FIG. 6 shows a dual beam system 600 using a FIB column 602 as described above. FIB column 602 includes an AVA drive mechanism 500 and a vacuum isolation valve 400, both of which are positioned within a system vacuum chamber 604. AVA drive mechanism 500 is contained within system vacuum chamber 604, and only electrical connections are required to extend outside of system vacuum chamber 604. Similarly, the vacuum isolation valve mechanism 400 is contained within system vacuum chamber 604, and only an air line for actuating the valve is required to extend outside of the chamber. Dual beam system 600 also includes a second beam system, in this case scanning electron microscope 610, directed toward the same work piece 608 as the FIB column.

Although the example provided illustrated a gun bushing, other portions of the optical column can be placed in a dielectric bushing. The invention is not limited to use with a liquid metal focused ion beam source, but can be used to construct other charged particle beam systems.

In some embodiments of the present invention, there are no mechanical feedthroughs into the system vacuum chamber. All mechanical devices are contained within the system vacuum chamber and only control means, such as electrical wires or pneumatic tubes, penetrate the vacuum chamber wall. Since the emitter assembly is prealigned, it requires no complex electrical mechanical motion in an automated FIB system.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. In a FIB system including a system vacuum chamber; an ion gun including liquid metal ion source; a plurality of lens elements for extracting and focusing ions, one or more beam apertures; and an electrostatic deflection means, the improvement comprising one or more dielectric bushings for positioning one or more lens elements and for providing a sealable vacuum container for the one or more elements, the interior of the vacuum container being vacuum selectively isolatable from the environment in the system vacuum chamber, and apertures including electroetched, electroformed, or laser ablated beam apertures.

2. In a FIB system including a system vacuum chamber; an ion gun including a liquid metal ion source; a plurality of lens elements for extracting and focusing ions, one or more beam apertures; and an electrostatic deflection means, the improvement comprising one or more dielectric bushings for positioning one or more lens elements and for providing a sealable vacuum container for the one or more elements, the interior of the vacuum container being vacuum selectively isolatable from the environment in the system vacuum chamber, an in-vacuum isolation valve mechanism, the in-vacuum isolation valve having no mechanical linkage from the valve to the outside of the system vacuum chamber.

3. The FIB system of claim 2 in which the in-vacuum isolation valve includes a pneumatic bellows to activate the valve.

4. The FIB system of claim 2 which the in-vacuum isolation valve includes a pushrod and bell crank to activate the valve.

5. An ion gun for a focused ion bean system, comprising: a gun chamber housing being at least partially constructed of a dielectric material and defining a gun chamber; an emitter assembly positioned within the gun chamber housing, the emitter assembly including a pre-aligned liquid metal ion emitter, a suppressor, an extractor and an extractor aperture; and one or more ion optical elements fastened to the gun chamber housing and aligned with the emitter assembly, the position of the emitter assembly is fixed in alignment relative to the one or more ion optical elements fastened to the dielectric housing.

6. In a particle beam system including a focused ion beam column within a system vacuum chamber, the focused ion beam column including a liquid metal ion source, a plurality of lens elements for extracting and focusing the ions, one or more beam apertures, an electrostatic deflection means, beam blanking means, and vacuum pump plus associated electronics and controls, the improvement comprising an in-vacuum isolation valve for isolating the gun vacuum container, the vacuum isolation valve actuation mechanism being operable without a mechanical drive connection to outside a system vacuum chamber.

7. The system of claim 6 in which the vacuum isolation valve is operated pneumatically and in which a pneumatic connection for operating the vacuum isolation valve passes through the wall of the system vacuum chamber.

8. In a particle beam system including a focused ion beam column within a system vacuum chamber, the focused ion beam column including a liquid metal ion source, a plurality of lens elements for extracting and focusing the ions, one or more beam apertures, an electrostatic deflection means, beam blanking means, and vacuum pump plus associated electronics and controls, the improvement comprising, an automated variable aperture drive positioned within the vacuum chamber, the drive being operable without a mechanical drive connection to outside the vacuum chamber.

9. The method of claim 8 in which the automated variable aperture drive includes a piezoelectric positioner.

10. The method of claim 8 in which the automated variable aperture drive includes an electric motor.

11. In a FIB system including a system vacuum chamber; an ion gun including a liquid metal ion source; a plurality of lens elements for extracting and focusing ions, one or more beam apertures; and an electrostatic deflection means, the improvement comprising an in-vacuum aperture changing mechanism including a drive mechanism that is contained within the system vacuum chamber, thereby eliminating the requirement for a mechanical feedthrough to change the aperture.

12. The FIB system of claim 11 in which the in-vacuum aperture changing mechanism comprises one or more piezoelectric actuators, DC motors or stepper motors for driving stage.

13. An ion gun for a focused ion beam system, comprising: a gun chamber housing being at least partially constructed of a dielectric material and defining a gun chamber; an emitter assembly positioned within the gun chamber housing, the emitter assembly including a pre-aligned liquid metal ion emitter, a suppressor, an extractor and an extractor aperture; and one or more ion optical elements fastened to the gun chamber housing and aligned with the emitter assembly, the emitter assembly being attached to the gun chamber housing and fixed in relation to the one or more ion optical elements.

14. In a FIB column including a system vacuum chamber; an ion gun including a liquid metal ion source; a plurality of lens elements for extracting and focusing the ions, one or more beam apertures; and an electrostatic deflection means, the improvement comprising an in-vacuum isolation valve for isolating the ion gun from the system vacuum chamber, the in-vacuum isolation valve having no mechanical linkage from the valve to the outside of the system vacuum chamber.

15. The FIB of claim 14 in which the in-vacuum isolation valve includes a pneumatic bellows to controllably activate the valve.

16. The FIB of claim 14 in which the in-vacuum isolation valve includes a pushrod and bell crank to activate the valve.

* * * * *

UNITED STATES PATENT AND TRADEMARK OFFICE
CERTIFICATE OF CORRECTION

| | | |
|---|---|---|
| PATENT NO. | : 6,710,338 B2 | Page 1 of 1 |
| APPLICATION NO. | : 09/982110 | |
| DATED | : March 23, 2004 | |
| INVENTOR(S) | : Robert L. Gerlach et al. | |

It is certified that error appears in the above-identified patent and that said Letters Patent is hereby corrected as shown below:

On the Title Page Item (73)

1. Assignee - Please change "Fei Company" to read "FEI Company";

Signed and Sealed this
Twelfth Day of April, 2011

David J. Kappos
*Director of the United States Patent and Trademark Office*